US010347773B2

(12) United States Patent
Si et al.

(10) Patent No.: US 10,347,773 B2
(45) Date of Patent: Jul. 9, 2019

(54) SPLIT GATE NON-VOLATILE MEMORY (NVM) WITH IMPROVED PROGRAMMING EFFICIENCY

(71) Applicant: GLOBALFOUNDRIES Singapore Pte. Ltd., Singapore (SG)

(72) Inventors: Wei Si, Singapore (SG); Zeng Wang, Singapore (SG); Jeoung Mo Koo, Singapore (SG); Raj Verma Purakh, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/807,539

(22) Filed: Nov. 8, 2017

(65) Prior Publication Data

US 2019/0140099 A1     May 9, 2019

(51) Int. Cl.
| | |
|---|---|
| *G11C 16/04* | (2006.01) |
| *H01L 29/788* | (2006.01) |
| *H01L 29/66* | (2006.01) |
| *H01L 27/11517* | (2017.01) |
| *H01L 21/28* | (2006.01) |
| *H01L 29/423* | (2006.01) |
| *G11C 16/34* | (2006.01) |

(52) U.S. Cl.
CPC ........ *H01L 29/7883* (2013.01); *G11C 16/045* (2013.01); *G11C 16/0416* (2013.01); *G11C 16/34* (2013.01); *H01L 21/28035* (2013.01); *H01L 27/11517* (2013.01); *H01L 29/42328* (2013.01); *H01L 29/66825* (2013.01)

(58) Field of Classification Search
CPC .......... H01L 29/7883; H01L 27/11517; H01L 21/28035; H01L 29/42328; H01L 29/66825; G11C 16/045; G11C 16/0416; G11C 16/34
See application file for complete search history.

(56) References Cited

U.S. PATENT DOCUMENTS

| | | | |
|---|---|---|---|
| 6,284,596 B1 * | 9/2001 | Sung ................... | H01L 27/115 257/E21.682 |
| 6,992,354 B2 * | 1/2006 | Nowak ............... | H01L 27/1203 257/344 |
| 7,253,470 B1 * | 8/2007 | Liu .................... | H01L 21/28273 257/316 |
| 9,349,815 B2 * | 5/2016 | Tseng ................ | H01L 29/42368 |

(Continued)

*Primary Examiner* — Khamdan N. Alrobaie
(74) *Attorney, Agent, or Firm* — Thompson Hine LLP

(57) ABSTRACT

Device and method of forming a non-volatile memory (NVM) device are disclosed. The NVM device includes NVM cells disposed on a substrate in a device region. The NVM cell includes a floating gate (FG) with first and second FG sidewalls disposed on the substrate and an intergate dielectric layer disposed over the FG and substrate. Re-entrants are disposed at corners of the intergate dielectric which are filled by dielectric re-entrant spacers. An access gate (AG) with first and second AG sidewalls is disposed on the substrate adjacent to the FG such that the second AG sidewall is adjacent to a first FG sidewall and separated by the intergate dielectric layer and the re-entrant spacers prevent AG from filling the re-entrants. A first source/drain (S/D) region is disposed in the substrate adjacent to the first AG sidewall and a second S/D region is disposed in the substrate adjacent to the second FG sidewall.

18 Claims, 10 Drawing Sheets

(56) References Cited

U.S. PATENT DOCUMENTS

| | | | |
|---|---|---|---|
| 9,356,074 B1* | 5/2016 | Shimabukuro | H01L 27/2481 |
| 2004/0256657 A1* | 12/2004 | Hung | H01L 27/115 |
| | | | 257/315 |
| 2005/0281125 A1* | 12/2005 | Chung | G11C 16/0425 |
| | | | 365/232 |
| 2011/0156121 A1* | 6/2011 | Teo | B82Y 10/00 |
| | | | 257/314 |
| 2014/0319593 A1* | 10/2014 | Yater | H01L 21/28273 |
| | | | 257/316 |
| 2015/0084102 A1* | 3/2015 | Park | H01L 29/785 |
| | | | 257/288 |

* cited by examiner

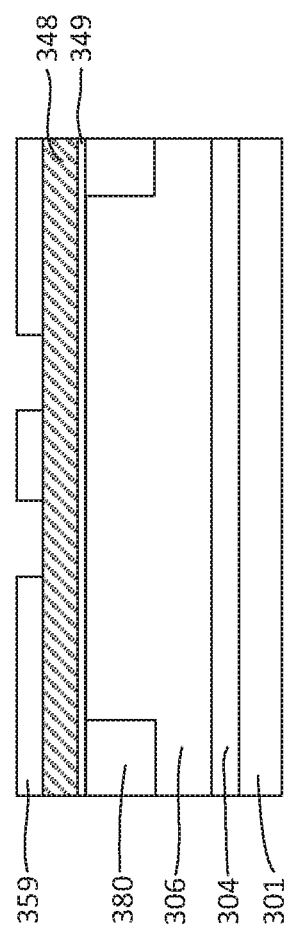

SPLIT GATE NON-VOLATILE MEMORY (NVM) WITH IMPROVED PROGRAMMING EFFICIENCY

BACKGROUND

Non-volatile memory (NVM) cells, such as split gate NVM cells, have achieved widespread adoptions for code and data storage applications. A split gate NVM cell may include an access gate (AG) and a floating gate (FG) disposed on a substrate. An AG is disposed adjacent to a FG separated by a tunneling dielectric layer. Both the AG and FG are separated from the substrate by an AG dielectric and a FG dielectric. Below the gates is a channel of the memory cell. The gates are separated from each other by an intergate dielectric. The AG serves as a wordline (WL).

Memory operations, such as programming and erasing, may involve, for example, charging or discharging electrons from a floating gate (FG) of the split gate NVM cell. The charging and discharging of electrons may be achieved by hot carrier injection (HCI) or Fowler Nordheim (FN) tunneling. An important aspect of split gate NVM cells is their performance, which includes efficient programming.

However, conventional split-gate NVM cells may suffer from inefficient programming efficiency. For example, a conventional split-gate NVM cell may be subjected to an increased electric field at the wordline (WL) corner. The increased electric field causes unnecessary HCI to the WL. This reduces hot electron injection to the FG. As a result, the programming efficiency is reduced.

From the foregoing discussion, it is desirable to provide a split-gate NVM cell with improved programming efficiency.

SUMMARY

Embodiments of the present disclosure generally relate to semiconductor devices or integrated circuits (ICs). More particularly, embodiments of the present disclosure relate to floating gate NVM cells. In one embodiment, a method of forming a non-volatile memory cell is disclosed. The method includes providing a substrate prepared with a device region, forming a floating gate (FG) with first and second sidewalls on the substrate, and forming an intergate dielectric layer which covers the FG and substrate. The intergate dielectric layer includes re-entrants at corners of the intergate dielectric layer. Dielectric re-entrant spacers are formed in the re-entrants and the dielectric re-entrant spacers fill the re-entrants at the corners of the intergate dielectric layer. An access gate (AG) is formed on the substrate adjacent to the FG. The AG includes first and second sidewalls. The second AG sidewall is adjacent to the first FG sidewall and separated by the intergate dielectric layer. The dielectric re-entrant spacers prevent AG from filling the re-entrants. The method further includes forming a first S/D region in the substrate adjacent to the first AG sidewall, and forming a second S/D region in the substrate adjacent to the second FG sidewall.

In another embodiment, a non-volatile memory (NVM) cell is described. The NVM cell includes a substrate prepared with a device region, a floating gate (FG) with first and second sidewalls disposed on the substrate, and an intergate dielectric layer which covers the FG and substrate disposed on the substrate. The intergate dielectric layer includes re-entrants at corners of the intergate dielectric layer. Dielectric re-entrant spacers are formed in the re-entrants and the dielectric re-entrant spacers fill the re-entrants at the corners of the intergate dielectric layer. An access gate (AG) is disposed on the substrate adjacent to the FG; The AG includes first and second sidewalls, which the second AG sidewall is adjacent to the first FG sidewall and separated by the intergate dielectric layer. The dielectric re-entrant spacers prevent AG from filling the re-entrants. The NVM further includes a first S/D region disposed in the substrate adjacent to the first AG sidewall, and a second S/D region disposed in the substrate adjacent to the second FG sidewall.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the disclosure. In the following description, various embodiments of the present disclosure are described with reference to the following drawings, in which:

FIGS. 3a-3g show an exemplary embodiment of a process flow for fabricating a device with a pair of split gate NVM cells.

DETAILED DESCRIPTION

Embodiments generally relate to semiconductor devices or integrated circuits (ICs). More particularly, embodiments of the present disclosure relate to eliminating poly stringers in floating gate metal oxide semiconductor (FGMOS) devices. FGMOS devices, for example, are employed in non-volatile memory devices, such as erasable programmable read-only memories (EPROMs), electrically erasable programmable read-only memories (EEPROMs), and flash memories. Other types of memories may also. The FGMOS devices may be embedded in various types of ICs or stand-alone memories.

Embodiments generally relate to semiconductor devices. More particularly, some embodiments relate to memory devices, such as split gate NVM devices. Such memory devices, for example, can be incorporated into standalone memory devices, such as USB or other types of portable storage units, or ICs, such as microcontrollers or system-on-chips (SoCs). The devices or ICs can be incorporated into or used with, for example, consumer electronic products, such as computers, cell phones, and personal digital assistants (PDAs).

Figure 1A:
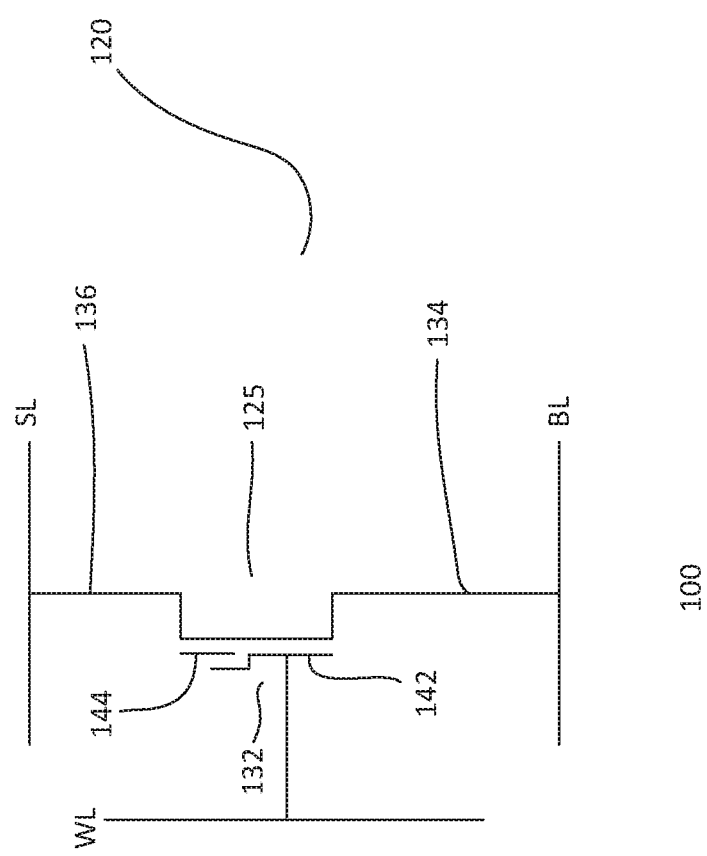
FIG. 1a shows a circuit diagram of an embodiment of a split gate NVM cell.

FIG. 1a shows a schematic diagram of an embodiment of a device 100. The device, as shown, includes a memory cell 120. The memory cell, in one embodiment, is a split gate NVM cell. The split gate NVM cell, for example, is a split gate transistor. The split gate transistor includes a split gate 132 disposed between first and second cell terminals 134 and 136. The split gate includes first and second gates 142 and 144. The first gate may be referred to as an access gate (AG) and the second gate may be referred to as a floating gate (FG).

The AG gate includes an AG gate electrode and an AG gate dielectric; the FG gate includes a FG gate electrode and FG gate dielectric. The gate electrodes may be polysilicon electrodes and the gate dielectrics may be silicon oxide, such as thermal silicon oxide. The AG gate dielectric and FG gate dielectric may be formed by a common gate dielectric. In some cases, the AG and FG dielectrics are different dielectrics. For example, the AG gate dielectric may be a composite dielectric of a thermal oxide and a high temperature oxide (HTO), in which the HTO may be disposed on the thermal oxide. The FG dielectric may be a thermal oxide. Other configurations of AG and FG dielectrics may also be useful.

The gates are disposed on a substrate, such as a semiconductor substrate, which serves as a body of the split gate transistor. The body below the gates serves as a channel of the transistor. The body, for example, includes second polarity type dopants for a first polarity type transistor. For example, the body may be doped with p-type dopants for a n-type transistor. Providing a n-type body for a p-type transistor may also be useful. The gate dielectrics separate the gate electrodes from the substrate or channel. The AG and FG are adjacent gates and separated by an intergate dielectric. The intergate dielectric may be a silicon oxide, such as HTO. The intergate dielectric may also serve as or be part of the AG dielectric.

In one embodiment, the AG is adjacent to and overlaps the FG. Other configurations of AG and FG may also be useful. The overlap portion of the AG may be referred to as a control gate. For example, the portion of the AG which overlaps the FG may be referred to as a control gate (CG). As for non-overlapping portion, it may be referred to as a word line or a select gate (SG). For example, the AG includes an overlapping portion which is the CG and the non-overlapping portion is the SG.

The channel 125, for example, is disposed between the first and second cell terminals. The terminals may be doped source/drain (S/D) regions in the substrate adjacent to non-adjacent sides of the AG and FG. For example, the first S/D region is disposed on the non-adjacent side of the AG and the second S/D region is disposed on the non-adjacent side of the FG. The S/D regions include first polarity dopants for a first polarity type transistor. For example, the S/D regions are n-type doped regions for a n-type transistor. Providing p-type S/D regions for a p-type transistor may also be useful.

A wordline (WL) is coupled to the AG, a bitline (BL) is coupled to the first cell terminal and a source line (SL) is coupled to the second cell terminal. The device may include a memory array formed by a plurality of memory cells. In one embodiment, a plurality of memory cells may be interconnected to form an array. For example, the memory cells may be interconnected by WLs in the row direction and BLs in the column direction. The SL may interconnect columns of memory cells.

In one embodiment, memory cells of an array may be arranged or configured in cell pairs in the column direction. For example, memory cells of a cell pair may share a common second cell terminal and SL. Other configurations of cells may also be useful.

The memory cells may be disposed in a memory region of the device. It is understood that the device may include other regions. For example, the device may be an embedded device with a memory region and a logic region. The logic region may include high voltage (HV), medium voltage (MV), low voltage (LV) regions or any combination thereof. Other types of regions may also be included in the device.

Figure 1B:
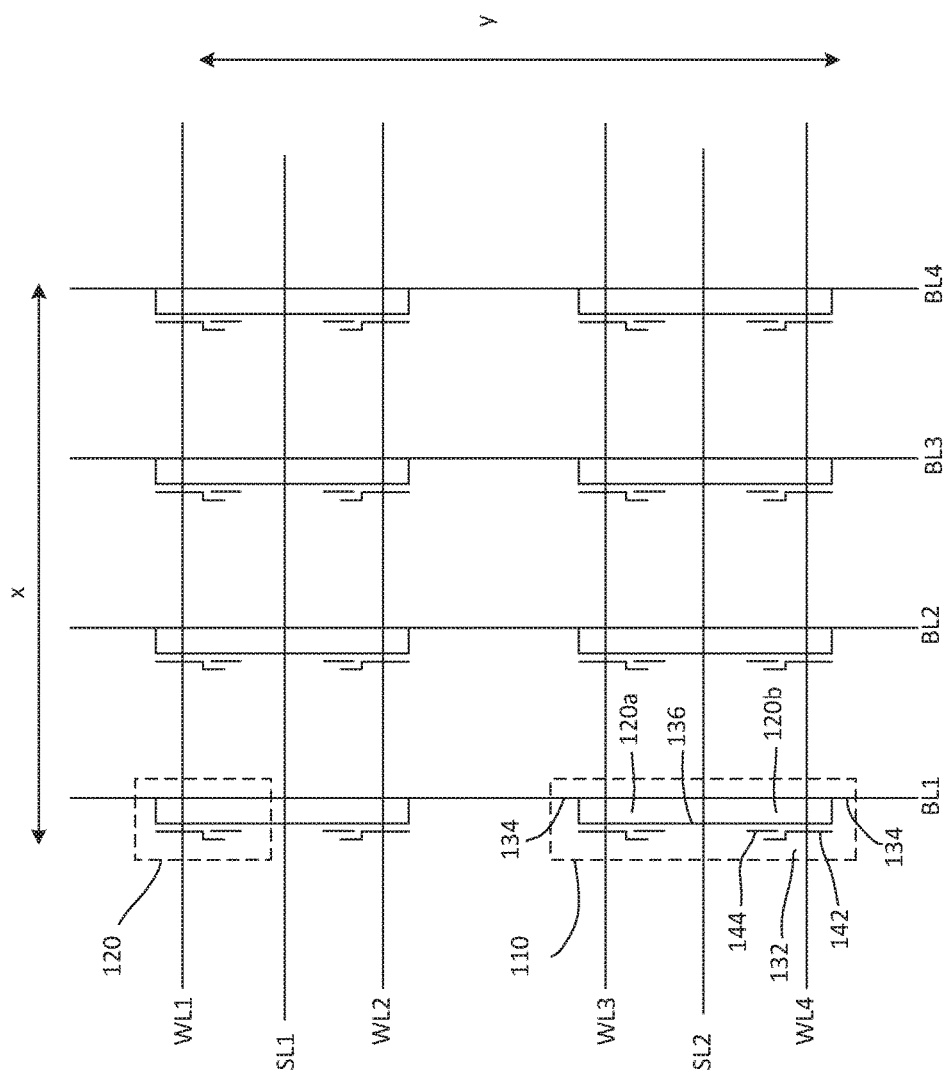
FIG. 1b shows a circuit diagram of an embodiment of an array of split gate NVM cells.

FIG. 1b illustrates an array 103 of split gate NVM cells 120. The memory cells are similar to the split gate NVM cells of FIG. 1a. Common elements may not be described or described in detail. The memory cell pairs of the array are arranged in first (x) and second (y) directions. The first direction, for example, is in a row direction and the second direction is in a column direction. For example, the array has x rows and y rows of memory cells, forming a x×y array. The row direction is in the WL direction and the column direction is in the BL direction. In one embodiment, the SL is in the same direction as the WL (row direction). Providing other configurations for the WLs, BLs and SLs may also be useful.

As shown, the array is 4×4 array. For example, the cells of the array are interconnected by four bitlines (BL1, BL2, BL3 and BL4) in the column direction, four wordlines (WL1, WL2, WL3 and WL4) in the row direction and two source lines (SL1 and SL2) in the row direction. Cells of a row share a common WL while cells of a column share a common BL. In one embodiment, the cells in the row direction are configured as cell pairs 110 having first and second memory cells 120*a-b*. In one embodiment, the memory cells of a cell pair share a common second terminal 136. For example, cells of a cell pair share a common SL. Adjacent memory cells of adjacent memory cell pairs of a row are isolated from each other. Other configurations of memory arrays may also be useful. Memory cell pairs may be isolated by, for example, isolation regions. Providing other row and column configurations may also be useful.

It is understood that the 4×4 array is merely exemplary. For example, an array may include numerous rows and columns. In addition, the array may be divided into sectors. A sector, for example, includes 8 rows and 2,000 columns. Providing other row and column configurations may also be useful. An array may include about 64 sectors for a 1 MB memory array. Providing other size arrays, sectors or other numbers of sectors may also be useful. Memory cell pairs may be isolated by, for example, isolation regions.

A memory cell may be accessed by applying appropriate voltages to the cell terminals. A memory access may include a program, a read operation or an erase operation. In one embodiment, a program access injects electrons into the FG while an erase operation involves electrons tunneling from the FG. Table 1 below shows various signals applied to the terminals of a memory array of selected and non-selected cells for the different memory operations:

TABLE 1

| Terminals | Cells | Read (V) | Program (V) | Erase (V) |
| --- | --- | --- | --- | --- |
| WL | Select | ≈Vdd | ≈1.5 V | ≈Vee |
|  | Non-select | 0 V | 0 V | 0 V |
| BL | Select | ≈0.8 V | ≈0. 8 V | 0 V |
|  | Non-select | 0 V | ≈Vdd | 0 V |
| SL | Select | 0 V | Vpp | 0 V |
|  | Non-select | 0 V | 0 V | 0 V |

The voltages listed in Table 1 are exemplary voltages for a n-type memory array. The voltage may vary, for example, depending on the design requirement and/or the technology node. Other voltages may also be useful.

In some embodiments, the memory array may be divided into small sectors. A small sector includes two adjacent rows of memories which share a common SL. For example, as shown, the 4×4 array may include 2 small sectors with 4 rows. The first small sector may include WL1 and WL2 with BL1, BL2, BL3 and BL4 while the second small sector may include WL3 and WL4 with BL1, BL2, BL3 and BL4. Dividing the array into small sectors enable erase operations to perform on a small sector basis. In other configurations, the array may include small and large sectors. Other configurations may also be useful.

Figure 2:
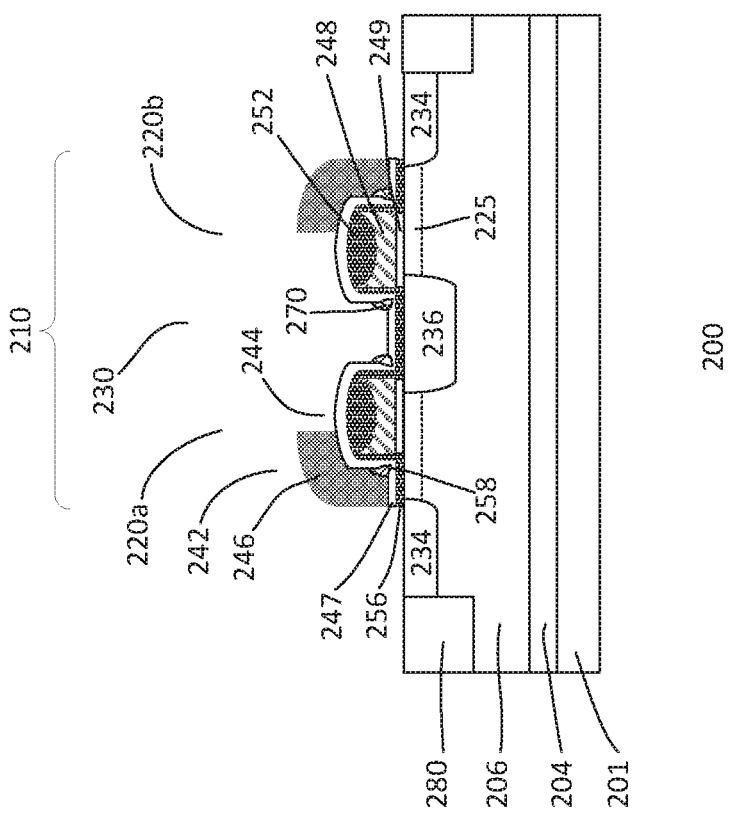
FIG. 2 shows an exemplary cross-sectional view of an embodiment of a pair of split gate NVM cells.

FIG. 2 shows a cross-sectional view of an embodiment of a device 200. The device includes a memory cell pair 210. The memory cell pair may include memory cells similar to that described in FIGS. 1a-1b. Common elements may not be described or described in detail. The device includes a substrate 201. The substrate, for example, may be a silicon substrate. The substrate can be lightly doped with p-type dopants. Other types of semiconductor substrates may also be used. For example, the substrate may be a silicon germanium or a crystalline-on-insulator (COI) substrate, such as a silicon-on-insulator (SOI) substrate. The substrate may be an intrinsic substrate or a doped substrate with other types of dopants.

The substrate may include doped regions having different dopant concentrations. For example, the device may include heavily doped (x+), intermediately doped (x) and lightly doped (x−) regions, where x is the polarity type of the dopants which can be p or n. A lightly doped region may have a dopant concentration of about $1E15$-$1E17/cm^3$, an intermediately doped region may have a dopant concentration of about $1E17$-$1E19/cm^3$, and a heavily doped region may have a dopant concentration of about $1E19$-$1E21/cm^3$. The dopant concentration, for example, may be for 130 nm technology node. Providing other dopant concentrations for the different types of doped regions may also be useful. For example, the ranges may be varied, depending on the technology node. In addition, the ranges may vary based on the type of transistors or devices, such as high voltage, intermediate voltage or low voltage transistors. P type dopants may include boron (B), aluminum (Al), indium (In) or a combination thereof, while n-type dopants may include phosphorous (P), arsenic (As), antimony (Sb) or a combination thereof.

The substrate may be prepared with a memory region containing memory cells of the device. The memory region can be referred to as an array region. Providing a substrate prepared with other types of regions (not shown) may also be useful. For example, the substrate may include a logic region (not shown) for support of other types of logic circuitry. The substrate may also include regions for other types of circuitry, depending on the type of device or IC. For example, the logic region may include sub-regions for high voltage (HV), intermediate voltage (IV) and low voltage (LV) devices.

In one embodiment, the memory cells are NVM memory cells. Providing other types of memory cells may also be useful. As shown, the memory cell region includes first and second memory cells $220_1$ and $220_2$. The first and second memory cells may be a memory cell pair 210 of the device. For example, the memory cell pair may be adjacent memory cells of a column of memory cells. It is understood that the memory cell region includes numerous memory cells arranged in columns and rows to form a memory array. The array may be configured to have sub-arrays or sectors.

The array region may include a doped device well 206. In one embodiment, the doped well is doped with second polarity type dopants for first polarity type memory cells. For example, the second polarity type may be p-type for n-type memory cells. Providing n-type doped well for p-type memory cells may also be useful. The doped well may be lightly or intermediately or heavily doped. Providing a doped well having other dopant concentrations may also be useful. The doped well may be a common doped well in the array region for the memory cells. The array well may be biased at an array well bias voltage ($V_{bias}$). The $V_{bias}$, for example, may be 0V. Other $V_{bias}$ may also be useful. The second polarity type doped well serves as a well for a first polarity type device. In one embodiment, the second polarity type includes p-type. For example, the p-type doped well serves as a well for a n-type memory cell. Providing a n-type doped well for a p-type memory cell may also be useful. The depth of the device well, for example, may be about 5 um. Other depths may also be useful.

The device may include appropriate device wells for the logic region. For example, device wells may be provided for devices in the LV, MV and HV regions. For each region, device wells may be provided for first and second polarity type devices. Furthermore, the dopant concentration of the device wells may be different depending on the type of device region. Other configuration of device wells may also be useful. The device wells may have depths ranging from about 5 μm. It is also understood that different device wells may have different depths.

In addition, the substrate may include a deep isolation well 204. The deep isolation well may be doped with isolation dopants. The isolation dopants may be first polarity type dopants. The isolation dopants may have the opposite polarity as the doped substrate. For example, in the case of a p-type doped substrate, the isolation dopants are n-type dopants. The deep isolation well isolates the device well from the substrate. The device may include deep isolation wells for different device regions. The depth of the deep isolation well should be sufficient to isolate the various device wells from the substrate. For example, the depth of the deep isolation well may be about 5 μm. Other depths may also be useful.

The substrate includes isolation regions 280 to isolate active device regions from other active device regions. The isolation regions, for example, are shallow trench isolation (STI) regions. Other types of isolation regions are also useful. As shown, an isolation region may be provided to isolate the memory cell pair from other memory cell pairs. For example, the isolation region isolates memory cell pairs in the column and row directions. Other configurations of isolation regions may also be useful.

In one embodiment, a memory cell includes a transistor 230 disposed on the substrate. The transistor, in one embodiment, is a split gate transistor. For example, the transistor includes a split gate disposed between first and second cell terminals 234 and 236. The split gate includes a first gate (AG) 242 and a second gate (FG) 244. The AG and FG share a common channel 225. The channel is disposed below the split gate and between the first and second terminals. As shown, the AG is adjacent to the first cell terminal and the FG is adjacent to the second cell terminal. The first gate serves as an access gate and the second gate serves as a storage gate. The first cell terminal may be the drain terminal and the second cell terminal may be the source terminal.

A FG, in one embodiment, includes a FG electrode 248 disposed over a FG dielectric 249. The FG electrode may be a polysilicon electrode and the FG dielectric may be a thermal oxide. The FG electrode may be a doped FG electrode. In one embodiment, the FG electrode is doped with first polarity type dopants, the same as the device type. The dopant concentration of the FG may be about $1E17$-$1E18/cm^3$. The thickness of the FG electrode may be about 900-1100 Å and the thickness of the FG dielectric may be about 80-100 Å. Other thicknesses for the electrode and dielectric may also be useful. The width of the FG may be about 300 nm. The Other widths and thicknesses may also be useful.

The FG includes first and second FG sidewalls. The second FG sidewall is adjacent to the second cell terminal. A FG polysilicon oxide (FG oxide) 252 is disposed on top of the FG. The thickness of the FG oxide may be about 1100-1300 Å. Other thicknesses may also be useful. As shown, the FG oxide has an oval cross-sectional shape. The FG oxide, for example, is formed by oxidizing the FG. In addition, the substrate surface and sidewalls of the FG includes an oxidation layer 256. The oxidation layer, for example, is formed by oxidizing the FG and exposed crystalline substrate surface. The thickness of the oxidation layer may be about 20-40 Å. Other thicknesses may also be useful.

In one embodiment, an intergate dielectric layer 247 is disposed over the FGs of the first and second memory cells and the substrate surface. For example, the intergate dielectric layer covers the oxidation layer 256. The intergate dielectric layer, in one embodiment, includes a HTO layer. The thickness of the intergate dielectric layer may be about 70-100 Å. Other thicknesses may also be useful. The intergate dielectric layer covers the substrate and FG. For example, the intergate dielectric layer covers the oxidation layer and FG oxide. The sidewalls of the FG include oxide re-entrants 258. As shown, the intergate or oxide re-entrants are located at corner of the FGs and substrate surface.

In one embodiment, dielectric re-entrant spacers 270 are disposed in the intergate re-entrants. The re-entrant spacers fill the intergate re-entrants. The dielectric re-entrant spacers can be etched selectively with respect to the intergate dielectric layer. In one embodiment, the re-entrant spacers include silicon nitride re-entrant spacers. Other types of dielectric spacers which can be selectively etched to the intergate dielectric layer may also be useful.

An AG 242 having first and second AG sidewalls is disposed on the substrate adjacent to the first sidewall of the FG and the first cell terminal. For example, the AG is disposed between the FG and the first cell terminal. The first AG sidewall is adjacent to the first cell terminal. As shown, the AG overlaps the FG and is separated by the FG oxide, oxidation layer and intergate dielectric. In addition, the AG overlaps the first cell terminal. The AG includes an AG electrode disposed over the AG dielectric. The AG electrode may be a polysilicon electrode. The AG electrode may be a doped AG electrode. The thickness of the AG electrode may be about 1500-1700 Å. Other thicknesses may also be useful. In one embodiment, the AG electrode is doped with first polarity type dopants, the same as the device type. As for the AG dielectric, in one embodiment, is the oxidation layer and intergate dielectric under the AG gate. The sidewalls of the AG may include dielectric sidewall spacers (not shown). The sidewall spacers may be a spacer stack with oxide and nitride layers. Other types of spacers may also be useful.

The split gate, for example, may be a split gate conductor. The split gate conductor may be a common split gate conductor for a plurality of transistors, for example, in the first or row direction. As such, the split gate conductor serves as a common split gate for a row of memory cells.

As discussed, the split gate is disposed between first and second cell terminals. The first and second cell terminals, for example, are first and second doped S/D regions. The doped S/D regions include first polarity type dopants. For example, the doped S/D regions are heavily doped regions with first polarity type dopants. In one embodiment, the first polarity type is n-type. Providing first polarity type which is p-type may also be useful. The doping concentration of the doped S/D regions may be about $1E14\text{-}5E15$ cm$^{-2}$. Other dopant concentrations may also be useful. The first S/D region serves as a drain terminal and the second S/D region serves as a source terminal. In one embodiment, the source terminal is a common source terminal of the memory cell pair. The source terminal is disposed between FGs of the first and second memory cells.

In one embodiment, the first S/D terminals may include lightly doped extension regions. The extension regions extend under the AG. The dielectric sidewall spacers may facilitate in aligning the heavily doped S/D regions and lightly doped extension regions. For example, extension regions may be formed, followed by dielectric sidewall spacers. The S/D regions are, for example, formed after the sidewall spacers. As such, the heavily doped S/D regions may be aligned with the spacers.

In one embodiment, the source terminal is coupled to or serves as a common source line (SL) of the memory cell pairs. The source terminal, for example, may traverse a row of memory cell pairs. Providing a source terminal which does not traverse a row of memory cell pairs may also be useful. The source terminal may be coupled to a SL disposed in a metal level of a back-end-of-line (BEOL) dielectric above the memory cells. As for the drain terminal, it is coupled to a BL disposed in a metal level of the device. The BL, for example, is coupled to drain terminals of a column of memory cells. The BL, for example, may be disposed in a metal level of a BEOL dielectric on the substrate above the memory cells and is coupled to the first doped regions by contacts (not shown). The BL, for example, is disposed along a second or column direction. As for the AG, it serves as or is coupled to a WL in a metal level of a BEOL dielectric. The WL is in the first or row direction.

As discussed, the BEOL dielectric is disposed over the substrate, covering the memory cells. The BEOL dielectric includes n plurality of interlevel dielectric (ILD) layers. An ILD layer includes a metal level dielectric with metal lines disposed over a via dielectric level with via contacts. The BEOL provides interconnections for the various components of the device, including external connections. The first ILD level (n=1) includes the first metal level M1 and via level $V_0$ (n−1) or contact level CA. An upper ILD level includes a metal level $M_n$ and a via level $V_{n-1}$. The via contacts and metal lines of an ILD level may be formed by single damascene, dual damascene, reactive ion etch (RIE) or a combination thereof. Contacts and metal lines may include copper or other types of conductive materials, such as tungsten (W) or aluminum (Al).

Typically, in the first ILD level, the CA and $M_1$ are formed using single damascene processes. The contacts in CA may be tungsten contacts and metal lines may be copper lines. As for upper ILD levels, the contacts and lines may be copper and may be formed by dual damascene processes. Disposed above the ILD levels may be a pad level dielectric with bond pads. The bond pads may be, for example, aluminum bond pads. Other configurations of ILD levels of the BEOL dielectric and pad level may also be useful.

The various lines of the memory array, as discussed, are provided in the BEOL dielectric. The lines in different directions are provided in different metal levels of the BEOL dielectric. For example, BLs and WLs are provided in different metal levels. Lines in the same direction may be provided in the same metal level. The lines are coupled to the various terminals of the cell by contacts in the via level.

For lines above $M_1$, contacts may be provided in the via levels as well as the metal levels, depending on the level which the lines are disposed.

Figure 3B:
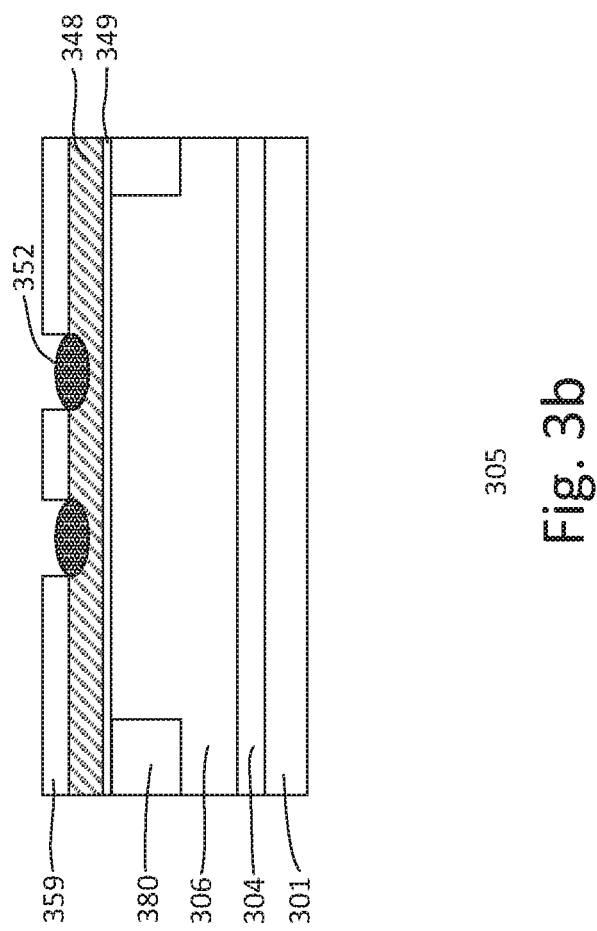

FIGS. 3a-3g show cross-sectional views of an embodiment of a process 300 for forming a device. The device, for example, is similar to that described in FIGS. 1a-1b and 2. Common elements may not be described or described in detail. Referring to FIG. 3a, a substrate 301 is provided. The substrate, for example, may be a silicon substrate. The substrate can be lightly doped with p-type dopants. Other types of semiconductor substrates may also be used. For example, the substrate may be silicon germanium or COI substrate, such as a SOI substrate. The substrate may be intrinsic or doped with other types of dopants.

The substrate may be prepared with a memory region containing memory cells of the device. The memory region may be referred to as an array region. Providing a substrate prepared with other types of regions (not shown) may also be useful. For example, the substrate may include a logic region for support of other types of logic circuitry. The substrate may also include regions for other types of circuitry, depending on the type of device or IC. For example, the logic region may include sub-regions for high voltage (HV), intermediate voltage (IV) and low voltage (LV) devices.

As shown, the substrate includes isolation regions 380 to isolate active device regions from other active device regions. The isolation regions, for example, are STI regions. Various processes may be employed to form the STI regions. For example, the substrate can be etched using etch and mask techniques to form trenches which are then filled with dielectric materials such as silicon oxide. Chemical mechanical polishing (CMP) may be performed to remove excess oxide and provide a planar substrate top surface. The STI regions may be formed, for example, prior to or after the formation of the doped wells. Other processes can also be used to form the STI regions. Other types of isolation regions are also useful.

The array region may be prepared to include a doped device well 306. The doped well may be prepared after forming the isolation regions 380. In one embodiment, the doped well is doped with second polarity type dopants for first polarity type memory cells. For example, the second polarity type may be p-type for n-type memory cells. Providing n-type doped well for p-type memory cells may also be useful. The doped well may be lightly or intermediately or heavily doped. Providing a doped well having other dopant concentrations may also be useful. The doped well may be a common doped well in the array region for the memory cells. The second polarity type doped well serves as a well for a first polarity type device. In one embodiment, the first polarity type is n-type and the second polarity type is p-type. For example, the p-type doped well serves as a well for a n-type memory cell. Providing a n-type doped well for a p-type memory cell may also be useful.

The doped well may be formed by selectively implanting second polarity type dopants into the substrate. Selectively implanting the dopants may be achieved using an implant mask, such as a patterned photoresist layer. The patterned resist mask includes an opening to expose the array region for implanting the second polarity type dopants into the substrate in the array region. Patterning the resist layer may be achieved by exposing it with an exposure source using a reticle with the desired pattern. The pattern of the reticle is transferred to the exposed resist layer which then serves as an implant mask.

The device may include appropriate device wells for the various device regions of the logic region. For example, device wells may be provided for devices in the LV, MV and HV regions. For each region, device wells may be provided for first and second polarity type devices. Furthermore, the dopant concentration of the device wells may be different depending on the type of device region. Other configurations of device wells may also be useful. The device wells may have depths of about 5 um. It is also understood that different device wells may have different depths.

In addition, the substrate may include a deep isolation well 304. The deep isolation well may be doped with isolation dopants. The isolation dopants may be first polarity type dopants. The isolation dopants may have the opposite polarity as the doped substrate. For example, in the case of a p-type doped substrate, the isolation dopants are n-type dopants. The deep isolation well isolates the device well from the substrate. The device may include deep isolation wells for different device regions. The depth of the deep isolation well should be sufficient to isolate the various device wells from the substrate. The deep isolation well, for example, is deeper than the device well.

The different wells may be formed using different implant processes. For example, different polarity wells may be formed using different implant processes. Also, different depth wells may be separately formed using separate implant processes with separate implant masks. In addition, in the case of deeper wells, multiple implants may be performed. Generally, the deep isolation well is performed prior to forming the other shallower wells. Other process flow for forming the wells may also be useful.

The substrate may also be implanted with dopants to define the initial gate threshold voltage ($V_t$) after forming the various wells. For example, multiple threshold adjust implants may be performed for different types of devices.

After performing the implants, the substrate is prepared with various layers of the FG. In one embodiment, a FG dielectric 349 is formed on the substrate followed by a FG electrode 348. The FG dielectric, for example, is a thermal oxide. The thermal oxide may be formed by thermal oxidation. As for the FG electrode, it may be a polysilicon layer formed by chemical vapor deposition (CVD).

An oxidation mask layer 359 is formed on the FG electrode. The oxidation mask layer, for example, may be a silicon nitride layer. Other types of oxidation masks may also be useful. The oxidation mask is patterned to expose portions of the FG electrode to be oxidized to form FG oxide. Patterning the oxidation mask may be achieved using mask and etch techniques. For example, a resist mask is patterned to serve as an etch mask. Patterning the resist mask may include exposing it with an exposure source with a reticle having the desired pattern. To improve lithographic resolution, an antireflective coating (ARC) may be provided below the resist layer. After exposure, the pattern of the reticle is transferred to the resist layer and the resist is developed. An anisotropic etch, such as a reactive ion etch (RIE), is employed to transfer the pattern of the resist mask to the oxidation mask.

Referring to FIG. 3b, counter doped regions (not shown) may be formed in the substrate. The counter doped regions include p-type dopants. For example, p-type dopants such as boron (B) are implanted into the substrate using the resist mask as an implant mask. The counter doped regions are disposed in the substrate in the device well below the resist mask openings. The depth of the counter doped regions may be about 1-2 µm. Another implant may be performed to dope the FG poly exposed by the mask openings. For example, n-type dopants are implanted into the FG poly to dope it.

After the implant processes, the resist mask is removed. Removal of the resist mask may be achieved by ashing. Other techniques for resist removal may also be useful. The substrate is annealed in an oxygen ambient, forming FG oxides 352 in the portions of the FG polysilicon exposed by the oxidation mask.

Figure 3C:
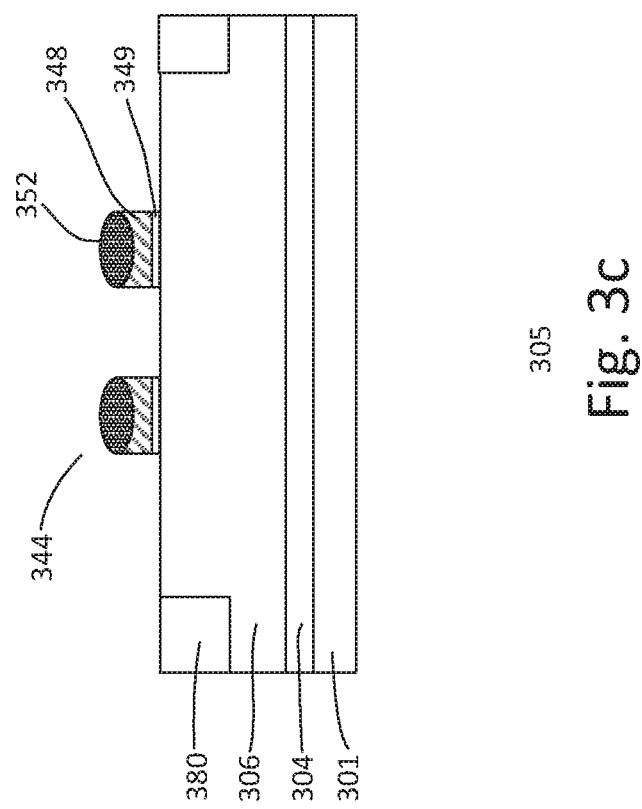

In FIG. 3c, the oxidation mask is removed. For example, the silicon nitride mask is removed. Removal of the oxidation mask may be achieved by wet etch selective to the oxide and FG polysilicon. For example, the nitride oxidation mask is removed by a wet etch selective to the FG oxide and the FG electrode. Other techniques for removing the oxidation mask may also be useful. An anisotropic etch, such as a RIE, is performed to pattern the FG electrode. The etch, for example, employs the FG oxide as an etch mask. FG dielectric exposed by the removal of the FG electrode is stripped by, for example, a wet etch. This forms FGs 344 on the substrate. As shown, a FG includes FG dielectric 349 on the substrate, FG electrode 348 on the FG dielectric and FG oxide 352 on the FG electrode.

Figure 3D:
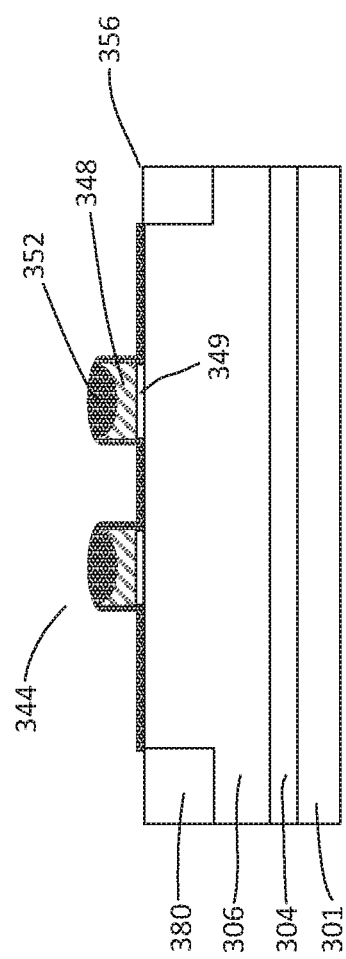

As shown in FIG. 3d, the substrate is annealed in an oxygen ambient to oxidize the exposed portions of substrate and exposed portions of FG electrode. This forms an oxidation layer 356. As shown, the oxidation layer is formed on the exposed crystalline substrate and sides of the FG electrode.

Figure 3E:
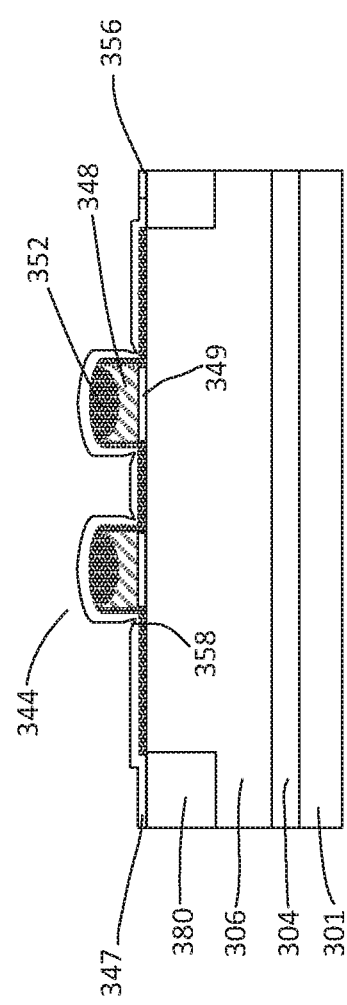

An intergate dielectric layer 347 is formed on the substrate, as shown in FIG. 3e. The intergate dielectric covers the substrate and FGs. For example, the intergate dielectric covers the oxidation layer 356 over the substrate and FGs. The intergate dielectric, in one embodiment, includes a HTO layer. The HTO layer may be formed by CVD following by densification with an anneal. As shown, the intergate dielectric layer includes re-entrants 358 located at the corners.

Figure 3F:
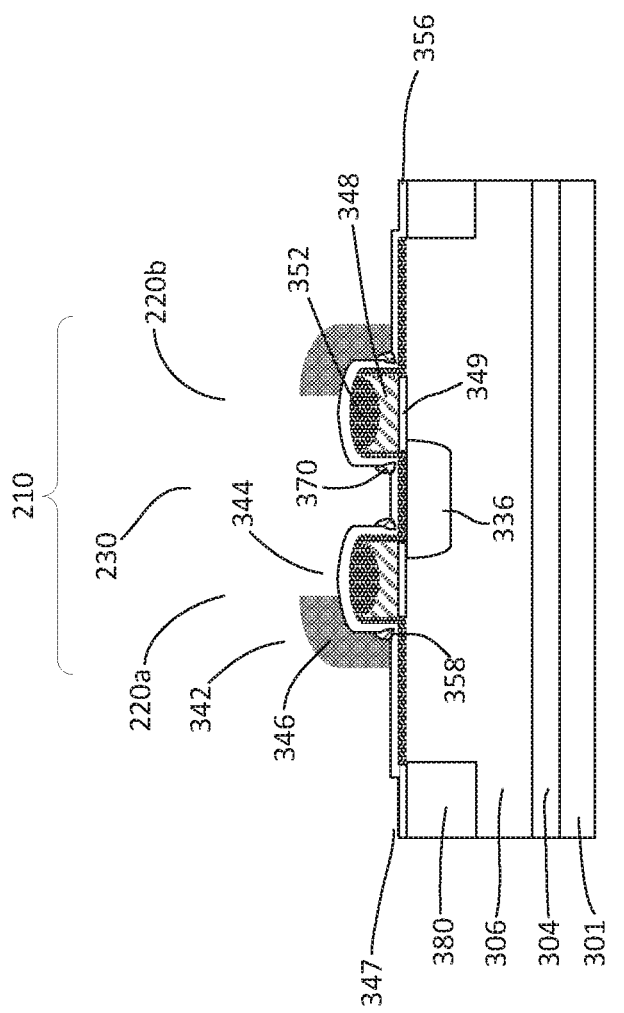

Referring to FIG. 3f, dielectric re-entrant spacers 370 are formed. The re-entrant spacers fill the re-entrants in the intergate dielectric layer. In one embodiment, forming the re-entrant spacers includes forming a dielectric spacer layer on the substrate. The dielectric spacer layer includes a dielectric material which can be etched selectively to the oxidation layer. In one embodiment, the dielectric spacer layer is a nitride layer formed by CVD. Other types of dielectric spacer layers or forming techniques may also be useful. The thickness of the dielectric layer should sufficiently fill the re-entrants in the intergate dielectric layer. For example, the thickness of the dielectric layer may be about 150-200 Å. Other thicknesses may also be useful. The dielectric spacer layer is etched back using, for example, an RIE. This removes the dielectric layers, leaving re-entrant spacers filling the re-entrants in the intergate dielectric layer.

The process may continue to process transistors in other device regions. For example, the process may form various gate dielectrics for transistors in the MV and HV regions. For example, the intergate dielectric and oxidation layers are removed in the MV and HV regions followed by forming MV and HV gate dielectrics. In one embodiment, the HV and MV regions have the same gate dielectric thickness. However, it is understood that the MV and HV gate dielectrics may have different thicknesses. As for the LV region, the oxidation layer may serve as a gate dielectric for LV transistors. For example, the intergate dielectric layer is removed in the LV region, leaving the oxidation layer. In some cases, device regions may include gate oxide which is a combination of the HTO, MV and LV oxides. Other configurations of gate oxides for other device regions may also be useful.

After the various gate dielectrics are formed, an AG electrode layer 346 is formed on the substrate. The AG electrode layer may also serve as the gate electrode for devices in other device regions, such as the LV, MV and HV regions. The AG gate electrode layer may be a polysilicon layer formed by CVD. The thickness of the AG gate electrode layer may be about 1400-1800 Å. Other thicknesses may also be useful. The AG electrode layer may be doped by ion implantation. In one embodiment, the AG electrode layer is doped with first polarity type dopants. The AG electrode may be intermediately doped. The electrode layer may also be doped in the other device regions. In some embodiment, the electrode layer is selectively doped in the other device regions as desired. In one embodiment, the electrode layer in first polarity type device regions are selectively doped with first polarity type dopants. For example, an implant mask may selectively provide openings in the device regions in which doping is desired. Doping gate electrodes with second polarity type dopants for second polarity type devices may also be useful.

The AG electrode layer is patterned using mask and etch techniques to form AGs adjacent to first sidewalls of the FGs. As shown, an AG overlaps a portion of the FG. For example, a portion of an AG extends beyond the first sidewall of a FG. The FG electrode layer is also patterned to form gates for devices in the other device regions. The etch, as shown, removes the AG electrode layer, leaving the remaining intergate dielectric and oxidation layers. As discussed, a split gate is a split gate conductor, serving as a common split gate for a row of memory cells. For example, the FGs and AGs extend a length of a row of cells.

After patterning the AG electrode layer, a second S/D region 336 is formed. Forming second S/D region includes implanting first polarity type dopants in the region between the FGs using an implant mask. The implant mask exposes the second S/D region between the FGs and protects the other regions of the substrate. The second S/D region extends a length of a row of cells. A second S/D region serves as a common SL for the memory cell pairs of a row of memory cells.

Figure 3G:
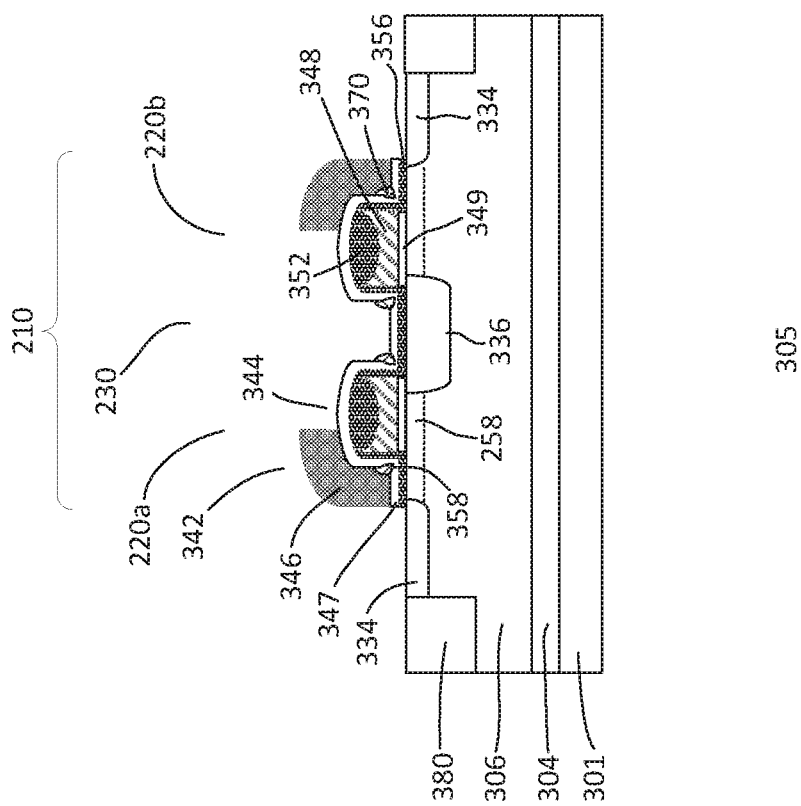

Referring to FIG. 3g, exposed intergate dielectric and oxidation layers over the first S/D regions and isolation regions are removed by, for example, a wet etch. A resist mask is provided to protect the intergate dielectric and oxidation layers over the FG and second S/D region. The wet etch may remove gate dielectric in the other device regions.

An implant is performed to form first S/D regions 334 adjacent to first sides of the AGs. The implant, for example, implants first polarity type dopants using an implant mask to form the first S/D regions. The depth of the first S/D regions may be shallower than the second S/D region. Other configurations of the S/D regions may also be useful.

In one embodiment, the implant to form first S/D regions may also be used to form first polarity type S/D regions for first polarity type devices in other device regions. In some embodiments, dielectric sidewall spacers may be formed on the sidewalls of the AG. Spacers may also be provided for devices in other device regions. In such cases, LD extensions are formed first, following by spacer formation and S/D implants. An anneal may then be performed to activate the dopants of various regions and layers.

The process continues to complete forming the device. For example, the process may continue to form BEOL dielectric with a plurality of ILD layers for forming interconnects to the memory cells and devices of other device regions. Other processes may also be performed to complete the device.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A method of forming a non-volatile memory (NVM) cell, comprising:
   providing a substrate prepared with a device region;
   forming a floating gate (FG) on the substrate, wherein the FG includes first and second FG sidewalls;
   forming an intergate dielectric layer on the substrate, wherein the intergate dielectric layer covers the FG and substrate, and the intergate dielectric layer comprises re-entrants at corners of the intergate dielectric layer respectively located at a first interface between the first FG sidewall and the substrate and at a second interface between the second FG sidewall and the substrate;
   forming dielectric re-entrant spacers in the re-entrants, wherein the dielectric re-entrant spacers respectively fill the re-entrants at the corners of the intergate dielectric layer;
   forming an access gate (AG) on the substrate adjacent to the FG, wherein the AG includes first and second AG sidewalls, wherein the second AG sidewall is adjacent to the first FG sidewall and separated by the intergate dielectric layer, and wherein the re-entrant spacers prevent the AG from filling the re-entrants;
   forming a second source/drain (S/D) region in the substrate adjacent to the second FG sidewall; and
   forming a first S/D region in the substrate adjacent to the first AG sidewall,
   wherein forming the FG comprises:
   forming a FG dielectric layer on the substrate;
   forming a FG electrode layer over the FG dielectric layer; and
   forming a FG polysilicon oxide on top of the FG and an oxidation layer on the first and second FG sidewalls and substrate surfaces by oxidizing the FG and substrate surfaces.

2. The method of claim 1, wherein providing the substrate comprises:
   doping the substrate with first polarity type dopants;
   forming an isolation well with first polarity type dopants in the substrate; and
   forming a device well with second polarity type dopants.

3. The method of claim 2, wherein the first polarity type dopants are p-type dopants and the second polarity type dopants are n-type dopants.

4. The method of claim 1, wherein forming the AG comprises forming an AG electrode in between the FG and the first S/D region, the AG electrode overlaps a portion of the FG and a portion of the first S/D region, and is separated by the FG polysilicon oxide, the oxidation layer and the intergate dielectric layer, and wherein the oxidation layer and the intergate dielectric layer under the AG serve as an AG dielectric.

5. The method of claim 1, wherein the first S/D region serves as a drain terminal, and the second S/D region serves as a source terminal and is coupled to a common source line (SL).

6. A method of forming a non-volatile memory (NVM) device, comprising:
   providing a substrate prepared with a memory region;
   forming at least a memory cell pair in the memory region, wherein the memory cell pair includes first and second memory cells, and wherein forming each of the first and second memory cells includes
      forming a first gate on the substrate, wherein the first gate includes first and second sidewalls,
      forming an intergate dielectric layer over the first gate and the substrate, wherein the intergate dielectric layer includes re-entrants at corners of the intergate dielectric layer,
      forming dielectric re-entrant spacers in the re-entrants, wherein the dielectric re-entrant spacers respectively fill the re-entrants at the corners of the intergate dielectric layer respectively located at a first interface between the first sidewall of the first gate and the substrate and at a second interface between the second sidewall of the first gate and the substrate,
      forming a second gate on the substrate adjacent to the first gate, wherein the second gate includes first and second sidewalls, wherein the second sidewall of the second gate is adjacent to the first sidewall of the first gate and separated by the intergate dielectric layer, and wherein the re-entrant spacers prevent the second gate from filling the re-entrants,
      forming a first source/drain (S/D) region in the substrate adjacent to the first sidewall of the second gate, and
      forming a second S/D region in the substrate adjacent to the second sidewall of the first gate,
   wherein forming the first gate comprises:
   forming a gate dielectric layer on the substrate;
   forming a gate electrode layer over the gate dielectric layer; and
   forming a gate polysilicon oxide on top of the first gate and an oxidation layer on the first and second sidewalls of the first gate and substrate surfaces by oxidizing the first gate and substrate surfaces.

7. The method of claim 6, wherein providing the substrate comprises:
   doping the substrate with first polarity type dopants;
   forming an isolation well with first polarity type dopants in the substrate; and
   forming a device well with second polarity type dopants.

8. The method of claim 7, wherein the first polarity type dopants are p-type dopants and the second polarity type dopants are n-type.

9. The method of claim 8, wherein the first gate serves as a floating gate (FG), and the second gate serves as an access gate (AG).

10. The method of claim 9, wherein forming the AG comprises forming an AG electrode in between the FG and the first S/D region, the AG electrode overlaps a portion of the FG and a portion of the first S/D region, the AG electrode is separated by the FG polysilicon oxide, the oxidation layer and the intergate dielectric layer, and wherein the oxidation layer and the intergate dielectric layer under the AG serve as an AG dielectric.

11. The method of claim 6, wherein the first S/D region serves as a drain terminal, the second S/D region serves as a source terminal, and the source terminal is a common source terminal of the memory cell pair and is coupled to a common source line (SL).

12. The method of in claim 6, wherein the first and second gates serve as a common split gate conductor for a plurality of memory cells.

13. A non-volatile memory (NVM) cell comprising:
a substrate prepared with a device region;
a floating gate (FG) disposed on the substrate, wherein the FG includes first and second FG sidewalls;
an intergate dielectric layer disposed on the substrate, wherein the intergate dielectric layer covers the FG and substrate, and the intergate dielectric layer comprises re-entrants at corners of the intergate dielectric layer;
dielectric re-entrant spacers disposed in the re-entrants, wherein the dielectric re-entrant spacers respectively fill the re-entrants at the corners of the intergate dielectric layer respectively located at a first interface between the first FG sidewall and the substrate and at a second interface between the second FG sidewall and the substrate;
an access gate (AG) disposed on the substrate adjacent to the FG, wherein the AG includes first and second AG sidewalls, wherein the second AG sidewall is adjacent to the first FG sidewall and separated by the intergate dielectric layer, wherein the re-entrant spacers prevent AG from filling the re-entrants;
a second S/D region disposed in the substrate adjacent to the second FG sidewall; and
a first S/D region disposed in the substrate adjacent to the first AG sidewall;
wherein the FG further includes:
a FG dielectric layer disposed on the substrate;
a FG electrode layer disposed over the FG dielectric layer;
a FG polysilicon oxide disposed on top of the FG; and
an oxidation layer disposed on the first and second FG sidewalls and substrate surfaces.

14. The NVM cell of claim 13, wherein the substrate is doped with first polarity type dopants, an isolation well with first polarity type dopants is formed in the substrate, and a device well is formed with second polarity type dopants.

15. The NVM cell of claim 14, wherein the first polarity type dopants are p-type dopants, and the second polarity type dopants are n-type.

16. The NVM cell of claim 13, wherein the AG comprises:
an AG electrode disposed in between the FG and the first S/D region, wherein the AG electrode overlaps a portion of the FG and a portion of the first S/D region, and the AG electrode is separated by the FG polysilicon oxide, the oxidation layer, and the intergate dielectric layer, and wherein the oxidation layer and the intergate dielectric layer under the AG serve as an AG dielectric.

17. The NVM cell of claim 13, wherein the first S/D region serves as a drain terminal, and the second S/D region serves as a source terminal and is coupled to a common source line (SL).

18. A method comprising:
providing a substrate prepared with a device region;
forming a gate on the substrate, wherein the gate includes first and second gate sidewalls;
forming an intergate dielectric layer on the substrate, wherein the intergate dielectric layer covers the gate and substrate, and the intergate dielectric layer comprises re-entrants at corners of the intergate dielectric layer located at a first interface between the first gate sidewall and the substrate and at a second interface between the second gate sidewall and the substrate; and
forming dielectric re-entrant spacers in the re-entrants, wherein the dielectric re-entrant spacers respectively fill the re-entrants at the corners of the intergate dielectric layer,
wherein forming the gate comprises:
forming a gate dielectric layer on the substrate;
forming a gate electrode layer over the gate dielectric layer; and
forming a gate polysilicon oxide on top of the gate and an oxidation layer on the first and second sidewalls of the gate and substrate surfaces by oxidizing the gate and substrate surfaces.

* * * * *